(12) United States Patent
Meinhold et al.

(10) Patent No.: US 8,994,179 B2
(45) Date of Patent: Mar. 31, 2015

(54) SEMICONDUCTOR DEVICE AND METHOD FOR MAKING SAME

(75) Inventors: Dirk Meinhold, Dresden (DE);
Heinrich Koerner, Bruckmuehl (DE);
Wolfgang Dickenscheid, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 1018 days.

(21) Appl. No.: 12/201,888

(22) Filed: Aug. 29, 2008

(65) Prior Publication Data

US 2010/0052178 A1 Mar. 4, 2010

(51) Int. Cl.
*H01L 23/48* (2006.01)
*H01L 23/532* (2006.01)
*H01L 21/768* (2006.01)
*H01L 23/522* (2006.01)

(52) U.S. Cl.
CPC .... *H01L 23/53238* (2013.01); *H01L 21/76834* (2013.01); *H01L 21/76849* (2013.01); *H01L 21/7685* (2013.01); *H01L 21/76888* (2013.01); *H01L 23/5226* (2013.01); *H01L 23/53223* (2013.01); *H01L 2221/1078* (2013.01)
USPC ........................................................ 257/773

(58) Field of Classification Search
CPC ........... H01L 2924/01079; H01L 2924/01078; H01L 23/5226; H01L 23/481
USPC ........... 257/E23.141, 775, 776, 773, 774, 758
See application file for complete search history.

(56) References Cited

U.S. PATENT DOCUMENTS

| | | | |
|---|---|---|---|
| 5,982,035 A | 11/1999 | Tran et al. | |
| 6,339,027 B1 | 1/2002 | Chok | |
| 6,433,433 B1 | 8/2002 | Sengupta | |
| 6,452,276 B1 * | 9/2002 | Cohen et al. | 257/763 |
| 7,317,253 B2 * | 1/2008 | Nogami | 257/758 |
| 7,323,781 B2 * | 1/2008 | Noguchi et al. | 257/758 |
| 7,741,228 B2 | 6/2010 | Ueki et al. | |
| 2004/0266167 A1 | 12/2004 | Dubin et al. | |
| 2006/0030143 A1 | 2/2006 | Ivanov | |
| 2006/0088975 A1 | 4/2006 | Ueda | |
| 2009/0039522 A1 * | 2/2009 | He et al. | 257/774 |
| 2009/0166882 A1 * | 7/2009 | Jeong | 257/774 |

* cited by examiner

*Primary Examiner* — Hoa B Trinh
(74) *Attorney, Agent, or Firm* — Slater & Matsil, L.L.P.

(57) ABSTRACT

One or more embodiments relate to a semiconductor device that includes: a conductive layer including a sidewall; a conductive capping layer disposed over the conductive layer and laterally extending beyond the sidewall of the conductive layer by a lateral overhang; and a conductive via in electrical contact with the conductive capping layer.

13 Claims, 10 Drawing Sheets

SEMICONDUCTOR DEVICE AND METHOD FOR MAKING SAME

TECHNICAL FIELD

The present invention relates to semiconductor devices and methods for making semiconductor devices.

BACKGROUND

In modern integrated circuits, conductive lines may be arranged within dielectric layers to interconnect semiconductor devices. These conductive lines may be formed of metal and may be arranged, for example, on different metallization levels. The conductive lines may be surrounded by, as well as separated by, interlevel dielectric (ILD) layers. Conductive vias can be formed between the conductive lines in order to provide a conductive connection between different metallization levels.

SUMMARY OF THE INVENTION

One or more embodiments relate to a semiconductor device, comprising: a conductive layer comprising a sidewall; a conductive capping layer disposed over the conductive layer and laterally extending beyond the sidewall of the conductive layer by a lateral overhang; and a conductive via in electrical contact with the capping layer. In one or more embodiments, the conductive layer may comprise a metallic material. In one or more embodiments, the metallic material may comprise a pure metal and/or a metal alloy.

One or more embodiments relate to a semiconductor device, comprising: a conductive layer comprising a sidewall; a conductive capping layer disposed over the conductive layer and laterally extending beyond the sidewall of the conductive layer by a lateral overhang greater than 2% of the lateral width of the conductive layer; and a conductive via in electrical contact with the conductive capping layer.

One or more embodiments relate to a semiconductor device comprising: a conductive layer comprising a sidewall; a conductive capping layer disposed over the conductive layer and extending laterally beyond the sidewall of the conductive layer by a lateral overhang; and a conductive via disposed over the conductive capping layer and including a portion disposed lateral to the sidewall of the conductive layer, the portion of the via being spaced apart from the sidewall.

One or more embodiments relate to a semiconductor device comprising: a metallic layer comprising a sidewall; a passivation layer disposed on the sidewall of the metallic layer; a conductive capping layer disposed over the metallic layer; and a conductive via disposed over the capping layer and including a portion disposed on the passivation layer.

One or more embodiments related to a method for manufacturing a semiconductor device, comprising: forming a first conductive layer with a sidewall; forming a second conductive layer over the first conductive layer such that the second conductive layer has an overhang extending laterally beyond the sidewall of the first conductive layer; and forming a third conductive layer over the second conductive layer, the third conductive layer including a portion formed to the side of the first conductive layer, a dielectric material being between the portion of the third conductive layer and the sidewall, the dielectric material being part of an interlevel dielectric layer.

BRIEF DESCRIPTION OF THE DRAWINGS

Embodiments of the present invention will be explained in the following with reference to the accompanying drawings, in which.

Before embodiments of the present invention will be explained in more detail in the following on the basis of the drawings, it is pointed out that like elements in the figures are provided with the same or similar reference numerals, and that a repeated description of these elements is omitted.

DETAILED DESCRIPTION OF ILLUSTRATIVE EMBODIMENTS

Figure 1:
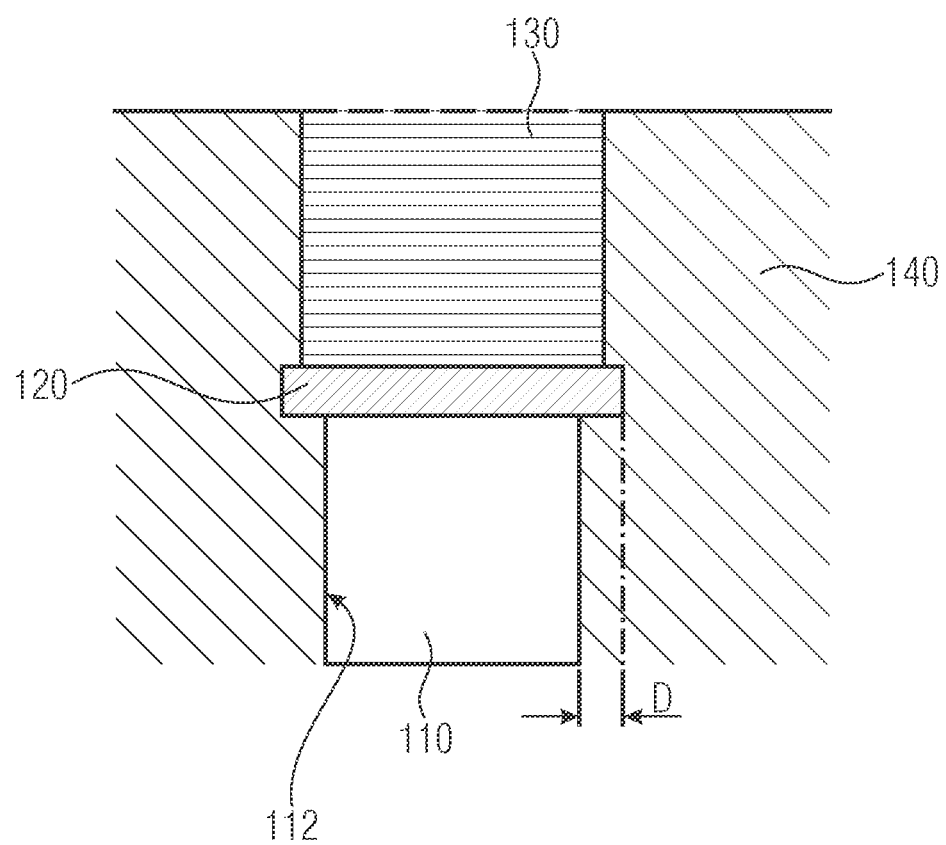
FIG. 1 shows a conductive via ending on a conductive capping layer according to an embodiment of the present invention.

In modern integrated circuits conductive layers between semiconductor devices are often formed as metal layers or lines arranged within dielectric layers. These metal layers or lines can, for example, be arranged on different metallization levels and can be separated by interlevel dielectric layers (ILD). The interlevel dielectric layers may comprise any dielectric material. Examples include oxides, nitrides, oxynitrides or combinations thereof In one or more embodiments, the metal layers or lines may comprise any metallic material. The metal layers or lines may comprise pure metals and/or metal alloys. Conductive via interconnections or simply conductive vias can be formed in order to provide a conductive connection between different interconnections or metal lines. For a reliable connection it is important that the conductive vias land on the metal lines and no short circuits appear and, hence, a reliable misaligned or borderless via interconnect is formed. In one or more embodiments, the conductive vias may comprise any metallic material. The metallic material may comprise a pure metal and/or a metal alloy.

In back end of line (e.g., BEOL) technology a wiring concept of metal lines may comprise, for example, Al (the element aluminum) and/or Cu (the element copper). Hence, the metal lines may comprise, for example, one or more of the materials selected from the group consisting of aluminum metal and copper metal. The aluminum metal may comprise pure aluminum and/or aluminum alloy. The aluminum alloy may, for example, be an aluminum-copper alloy. The copper metal may comprise pure copper and/or copper alloy. The copper alloy, may for example, be a copper-aluminum alloy. In one or more embodiments, the metal lines may, for example, be formed as a first metal/second metal stack where the first metal/second metal may be aluminum metal/copper metal or it may be copper metal/aluminum metal.

A capping layer may be formed over the metal lines. The capping layer may comprise, for example, a titanium metal/titanium nitride (Ti/TiN) stack or tantalum metal/tantalum nitride (Ta/TaN) stack. The titanium metal may comprise pure titanium and/or titanium alloy. The tantalum metal may comprise pure tantalum and/or tantalum alloy.

A conductive via may then be formed over the capping layer and electrically contact the capping layer. In one or more embodiments, the conductive via may actually physically contact the capping layer. The conductive via may stop in the capping layer. The conductive via may comprise a tungsten metal. The tungsten metal may comprise pure tungsten and/or tungsten alloy.

In one or more embodiments, a capping layer may include a TiN or TaN film which may promote tungsten metal fill nucleation. The capping layer may provide no containment to the precursors used for the tungsten metal fill and a problem may emerge if the conductive via touches or perforates a sidewall of the metal line due to a lateral overlay error with respect to the underlying metal line. This problem may be avoided if the metal line comprises a sufficient overhang with respect to the conductive via and the metal line, wherein the amount of overhang is given by the manufacturing tolerances or the manufacturing errors.

On the other hand, in order to minimize chip area, conventional BEOL technology is often designed with zero via/line overlap or with a corresponding marginal overlay specification, which is less than the typical tolerances and variances of the processes and the integration scheme. The consequence is that conductive vias are often not fully landed over the metal line, but the via hole etch extends deeply into the interlevel dielectric (ILD) layer laterally next to the line. In an extreme case, this leads to increased intra- or interlevel leakage or even shorts. But even if such interlevel shorts can be avoided, the via hole etch, subsequent via hole clean and the tungsten metal via fill process can comprise detrimental impact on the sidewall of the metal line, which is hit by these processes. Especially a via hole fill process as, for example, using tungsten-hexafluoride (WF6) precursors may be very aggressive with respect to a metal line.

If the conductive via does not reliably stop in the capping layer due to a direct breakthrough, or if the conductive via touches or perforates the metal line sidewall (due to the lateral overlay error with respect to the underlying metal line), the via hole etch process and/or the via hole clean process and/or the liner fill process may take place on the metal line surface (e.g., along the sidewall) leading to a number of mechanisms hampering the via/metal interface. In addition, the tungsten metal fill process may no longer be contained by the capping layer and may affect the conductive via/capping layer/metal line interface, and/or, attack the exemplary aluminum metal or copper metal material of the metal line.

Depending on the precursors used for the tungsten fill, for example, a high ohmic AlF (Aluminum Fluoride) interface, or a void between an AlCu alloy and tungsten metal via, will be the result. This can cause a shift in the resistance of the conductive via/metal line interface and provides a mechanism for electro migration failure and thus a reduction of the operation time to failure. Therefore, it is important to ensure that the metal line remains shielded during the process of forming the conductive via. In fact, the electro migration lifetime of misaligned conductive via/line interconnects is significantly worse than a well-processed reference.

To avoid the above-mentioned mechanism, the conductive via, while partly misaligned with respect to the underlying metal line, should not perforate the metal line (which may, for example, be an AlCu alloy).

Conventional approaches either try to avoid the conductive via/line misalignment by:
  (i) providing landing pads covering the expected overlay error; or
  (ii) limiting the tolerable overlay error.

In these approaches either the routing pitch and hence the chip size is considerably increased or the overlay-rework is increased. In addition, more performance and/or more expensive lithographic tools may be needed. In other conventional approaches the misalignment is allowed, but the detrimental attack of the metal line is avoided by either using one or more etch stop/hard mask layer, by applying additional spacers next to the metal line sidewalls. These conventional approaches consume chip area, increase processing costs and complexity and do not provide a reliable overall protection. Especially in aggressive design rules, there is a latent risk that conductive vias might (occasionally) be misaligned and that the conductive via/metal line reliability might no longer meet the requirements.

Hence, there is a need for a solution, which allows borderless or even misaligned conductive vias without sacrificing the liability performance or increasing process complexity and costs.

Embodiments of the present invention accomplish this by making use of a deliberate overhang of the conductive line with a conductive capping layer having an overhang with respect to the underlying metal line and, optionally, a deliberately enhanced passivation of the sidewall of the metal line. The passivation layer may, for example, comprise an oxide and/or a nitride. In one or more embodiments, the passivation layer may be used with the overhang. In one or more embodiments, the passivation layer may be used without the overhang. In one or more embodiments, the conductive via may contact the passivation layer.

Therefore, embodiments of the present invention relate to a semiconductor device comprising a conductive layer (for example, a metal layer or metal line) comprising a sidewall (for example, a lateral sidewall), a conductive capping layer disposed over the conductive layer and laterally extending beyond the sidewall (for example, the lateral sidewall) of the conductive layer by an overhang. In one or more embodiments, the overhang may be greater than about 5 nm. In one or more embodiments, the overhang may be greater than about 10 nm. In one or more embodiments, the overhang may be greater than about 15 nm. In one or more embodiments, the overhang may be greater than about 20 nm. In one or more embodiments, the overhang may be less than about 50 nm. In one or more embodiments, the overhang may be less than about 40 nm. In one or more embodiments, the overhang may be between about 5 nm and about 50 nm.

The semiconductor device further comprises a conductive via. The conductive via may be formed over the conductive capping layer and may be in electrical contact with the conductive capping layer. In one or more embodiment, the conductive via may be in contact with the conductive capping layer. One or more dielectric layers, such as one or more interlevel dielectric (ILD) layers may be laterally surrounding the conductive layer, the conductive capping layer and the conductive via.

Embodiments of the present invention also comprise a method for manufacturing a semiconductor device, wherein the method comprises forming a conductive layer, forming a conductive capping layer over the conductive layer so that the conductive layer extends beyond the sidewall of the conductive layer by a lateral overhang. In one or more embodiments, the lateral overhang may extend over about 5 nm. The method comprises optionally structuring or patterning of the conductive layer and the conductive capping layer. The step of structuring comprises, for example, an annealing process and/or a selective wet-chemical etching process and/or a dry etching process. In one or more embodiments, the dry etching process may comprise metal reactive ion etching (RIE). Optionally, the method comprises a passivation step after the dry (for example, RIE) etching or a wet-chemical step. Optionally, the method comprises an annealing step after the RIE metal etching.

Embodiments thus provide an overhang of the conductive capping layer with respect to the metal line and may, optionally, comprise an enhanced sidewall passivation of the metal line.

By making use of an intentionally pronounced overhang of the capping layer with respect to the underlying metal line and/or optionally by a deliberately enhanced passivation of the line sidewall a partly misaligned via may not yield to an attack of the line during the processing. As a result, embodiments of the invention tolerate borderless or misaligned conductive vias and prevent any detrimental attack to the metal line. This may be accomplished by either leaving a narrow interlevel dielectric layer or volume between the conductive via and the metal line and/or by providing a deliberate sidewall passivation. The sidewall passivation may, for example, provide an oxide or a nitride surface of the metal line. Embodiments show unique electrical and reliability performance without increasing process costs, complexity or chip size.

Thus, embodiments allow borderless and/or misaligned vias by avoiding any detrimental attack of the metal line by leaving a distinct volume of the intermetal dielectric layer (e.g., the ILD layer) and/or optionally another type of protective layer between a sidewall of the metal line and a portion of the conductive via which is laterally spaced apart from the sidewall. A detrimental attack of the metal line can, for example, be caused by the via etch, the cleaning or the WF6 (tungsten hexafluoride)-chemistry, and other processes. Thus, the metal line sidewall is no longer exposed to any attack at any state of processing even in the case of a partly misaligned via.

Further benefits of embodiments comprise structures with misaligned vias that show identical reliability performance, for example, with respect to electromigration and stress migration, and identical electrical parameters as those with fully landed vias. Embodiments do not require or need a separate landing pad and hence less chip area is consumed. In addition, overlay specification can be relaxed and even borderless vias are tolerated. Further benefits comprise that less-(overlay) performance tools can be used for exposure and less rework is required (no expensive photolithographic tools are needed). Since no extra layers or processes are needed also low costs and low complexity can be maintained and a standard PVD-liner (physical vapour deposition) can be used for tungsten fill.

FIG. 1 shows a semiconductor device according to an embodiment of the present invention, wherein a conductive layer 110 comprising a sidewall 112 (for example, a lateral sidewall), and wherein a conductive capping layer 120 is arranged over the conductive layer 110 and laterally extends beyond the lateral sidewall 112 of the conductive layer 110 by the lateral overhang D. In one or more embodiments, the lateral overhang D may greater than about 5 nm. In one or more embodiments, the overhang D may be greater than about 10 nm. In one or more embodiments, the overhang D may be greater than about 15 nm. In one or more embodiments, the overhang D may be greater than about 20 nm. In one or more embodiments, the overhang D may be less than about 50 nm. In one or more embodiments, the overhang D may be less than about 40 nm.

In the embodiment shown in FIG. 1, the semiconductor device comprises a conductive via 130 disposed over the capping layer 120 and in electrical contact with the capping layer 120. In the embodiment shown, the conductive via 130 is disposed on the capping layer 120, however, in other embodiments, it is possible that one or more additional layers be disposed between the conductive via 130 and the capping layer 120. The device may further comprise a dielectric layer 140 which laterally surrounds the conductive layer 110 and the conductive capping layer 120 as well as the conductive via 130. The dielectric layer 140 may comprise one or more interlevel dielectric (ILD) layers.

Possible materials for the layers can be chosen such that conductive layer 110 may comprise any conductive material. In one or more embodiments, the conductive material may comprise any metallic material. In one or more embodiments, the conductive material may comprise at least one of the elements Al or Cu. In one or more embodiments, the conductive layer 110 (which may, for example, be a metal layer or metal line) may comprise, for example, aluminum metal and/or copper metal, the conductive capping layer 120 comprises, for example, titanium metal and/or titanium nitride and the conductive via 130 comprises, for example, tungsten metal. The titanium metal may be pure titanium or a titanium alloy. The tungsten metal may be pure tungsten or tungsten alloy. The aluminum metal may be pure aluminum or aluminum alloy. The copper metal may be pure copper or a copper alloy. In one or more embodiments, the conductive layer may be an aluminum alloy.

The conductive capping layer 120 may serve, for example, as an anti-reflective coating (ARC) during lithographic processes, as a stress release between the material of the conductive via 130 and the conductive layer 110 and, in addition, can be used as a etch stop layer in the process of forming an opening for the conductive via 130 within the dielectric layer 140. The dielectric layer 140 can, for example, be one of the interlevel dielectric (ILD) layers or intermetal dielectric layers within an integrated circuit. In one or more embodiments, the capping layer 120 may comprise a conductive nitride. Examples include TiN and TaN. In one or more embodiments, the capping layer 120 may be a stack such as a titanium metal/TiN stack or a tantalum metal/TaN stack.

Figure 2:
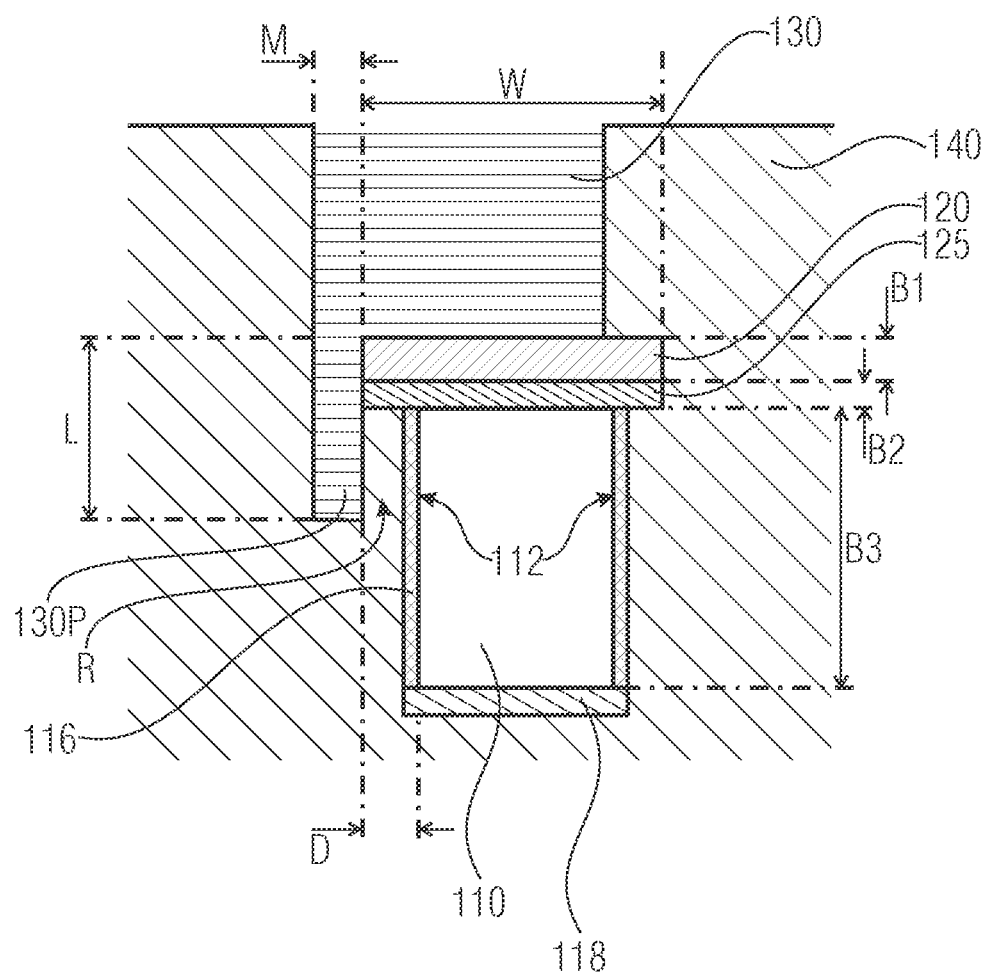
FIG. 2 shows a misaligned conductive via.

FIG. 2 shows a partially misaligned conductive via 130 disposed over the capping layer 120. The conductive via 130 is misaligned with respect to a capping layer 120 by a misalignment M. In the embodiment as shown in FIG. 2, the misalignment M appears with respect to the left-hand side of the conductive capping layer 120. As a result, when forming an opening for the conductive via 130 within the dielectric layer 140, the opening continues on the left-hand side of the capping layer 120 up to a depth L beneath the conductive capping layer 120. As a result, the conductive via 130 includes a portion which directly overlies the capping layer 120 as well as a portion 130P which is disposed lateral to the conductive layer 110 and spaced apart from the sidewall 112 of the conductive layer 110. Hence, because the capping layer 120 extends laterally beyond the sidewall 112, conductive via 130 includes a portion 130P which is laterally disposed from and also spaced apart from the sidewall 112. The portion 130P is laterally separated from the sidewall 112 by a portion of the dielectric layer 140 within a region R. The portion of the dielectric layer 140 within the region R may also be part of an interlevel dielectric (ILD) layer.

The portion of the dielectric layer 140 within the region R may comprise a thickness of approximately the lateral overhang D of the conductive capping layer 120 over the conductive layer 110 and reflects the aforementioned overhang effect of the conductive capping layer 120 with respect to the conductive layer 110. In addition, the overhang D can be chosen such that the portion of the dielectric layer 140 within the region R is strong enough to withstand the processing (e.g., the used aggressive chemistry) of the conductive via 130.

In the embodiment as shown in FIG. 2 between the conductive capping layer 120 and the conductive layer 110 an optional intermediate layer 125 may be disposed, which can, for example, be used as a further stress release between the conductive capping layer 120 and the conductive layer 110.

In one or more embodiments, as a further option, the conductive layer 110 can comprise a passivation layer 116, which may be formed along the sidewall 112 of the conductive layer 110. The passivation layer 116 may serve as additional protection with respect to processes of forming the conductive via 130.

The optional passivation layer 116 may, for example, comprise an oxide or a nitride. The oxide may, for example, be aluminum oxide which may be formed by an oxidation process, which is done, for example, after forming the conductive layer 110.

In one or more embodiments, a base layer 118 may be formed below the conductive layer 110. The base layer 118 may comprise, for example, titanium metal and/or titanium nitride (TiN).

In one or more embodiments, the conductive capping layer 120 comprises a thickness B1, which may be, for example, within a range of about 10 nm to about 80 nm or between about 30 nm and about 60 nm or between about 40 nm and about 45 nm.

In one or more embodiments, the lateral overhang D of the conductive capping layer 120 may be within the range of about 5 nm and about 50 nm. The overhang D may be measured with respect to the sidewall 112 of the conductive layer 110. Examples include, but are not limited to, overhang distances of about 5 nm, 10 nm, 15 nm, 20 nm, 25 nm, 30 nm, and 40 nm. In one or more embodiments, the overhang D may be greater than about 2% of a lateral width W of the conductive layer 110. In an embodiment, the overhang D may be at least about 5% of a lateral width W of the conductive layer 110. In an embodiment, the overhang D may be at least about 10% of a lateral width W of the conductive capping layer 120. In an embodiment the overhang D may be less than about 20% of the lateral width of the conductive layer 110. In an embodiment, the overhang D may be less than about 15% of the lateral width of the conductive layer 110.

An optional intermediate layer 125 may be disposed between the capping layer 120 and the conductive via 130. The intermediate layer may be formed of a conductive material. In one or more embodiments, the intermediate layer may be metallic. In one or more embodiments, the intermediate layer may be a conductive nitride. The intermediate layer 125 comprises a thickness B2, which is, for example, within a range of about 2 nm to about 12 nm or between about 2 nm and about 7 nm or between about 3 nm to about 6 nm or about 5 nm.

The conductive layer 110 comprises a thickness B3, which is, e.g., within a range between about 200 nm and about 1000 nm or between about 200 nm and about 500 nm or between about 250 nm and about 500 nm or between about 300 nm and about 350 nm or about 330 nm. In one or more embodiments, the conductive layer 110 may be a metal layer such as a metal line. In one or more embodiments, the conductive layer 110 may comprise a metallic material. In one or more embodiments, the conductive layer 110 may comprise the element Al and/or the element Cu. The conductive layer 110 may comprise an AlCu alloy comprising, Al with about a portion of Cu (the element copper) within a range of about 0.2% to about 1% or about 0.5%. In one or more embodiments, the conductive layer 110 may comprise at least one material selected from the group consisting of pure aluminum, aluminum alloy, pure copper, and copper alloy.

In further embodiments the capping layer 120 comprises a layer stack of further layers, with materials such that a further stress release is achieved or the electromigration or stress migration is further limited. Perpendicular to the drawing plane, the conductive layer 110 may extend beyond the conductive via 130, which may contact the conductive layer 110 only within a contact region. In further embodiments, the conductive via 130 forms a conductive interconnect so that the conductive via 130 electrically contacts to conductive layers on both ends, which means that in FIG. 2 only one conductive layer is shown and the conductive via 130 extends up to a next level, in which a further conductive layer is arranged (towards the top of the drawing plane in FIG. 2, not shown in FIG. 2).

Figure 3A:
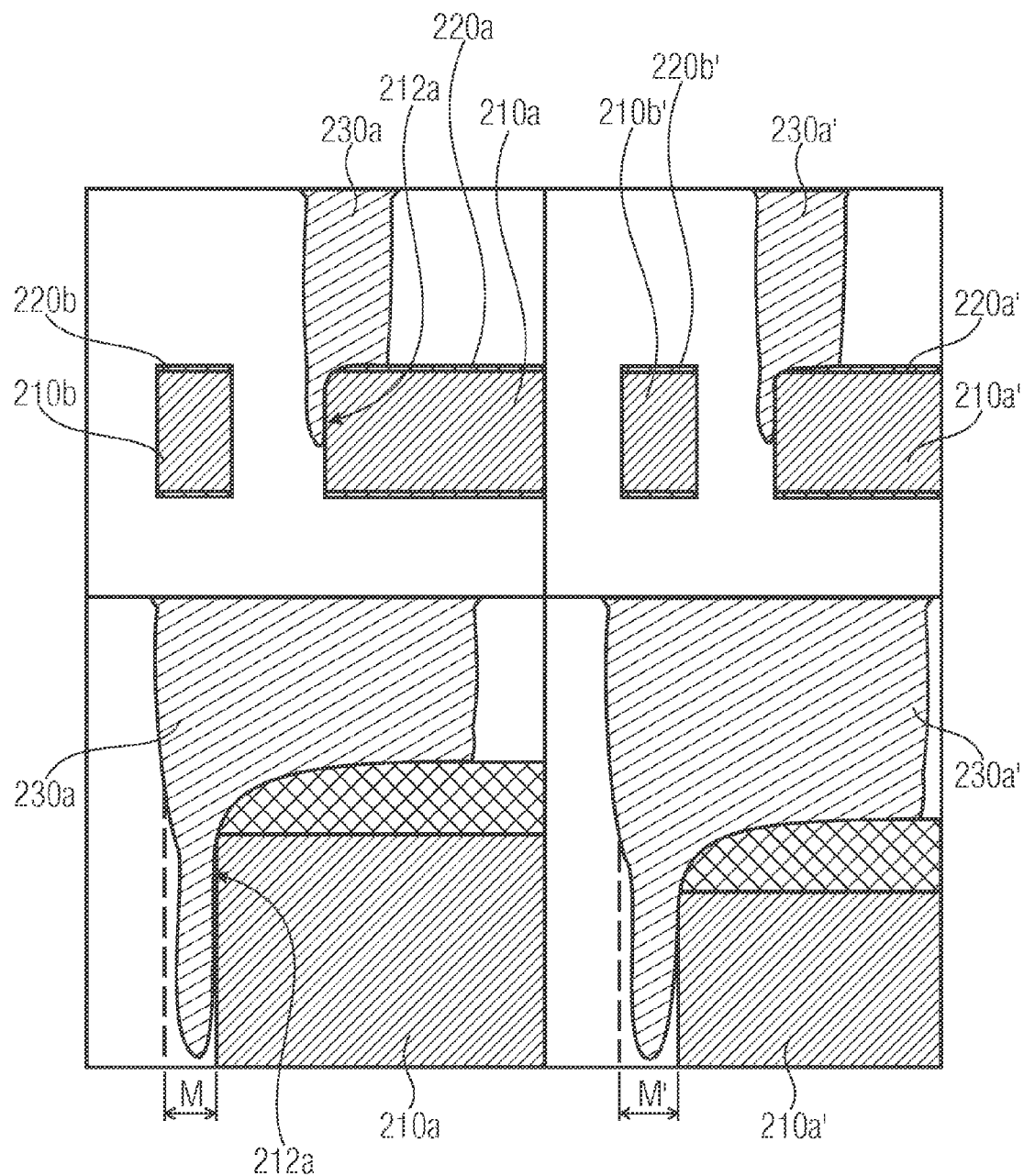
FIGS. 3a-3c show a comparison between aligned and misaligned conventional conductive vias.
Figure 3B:
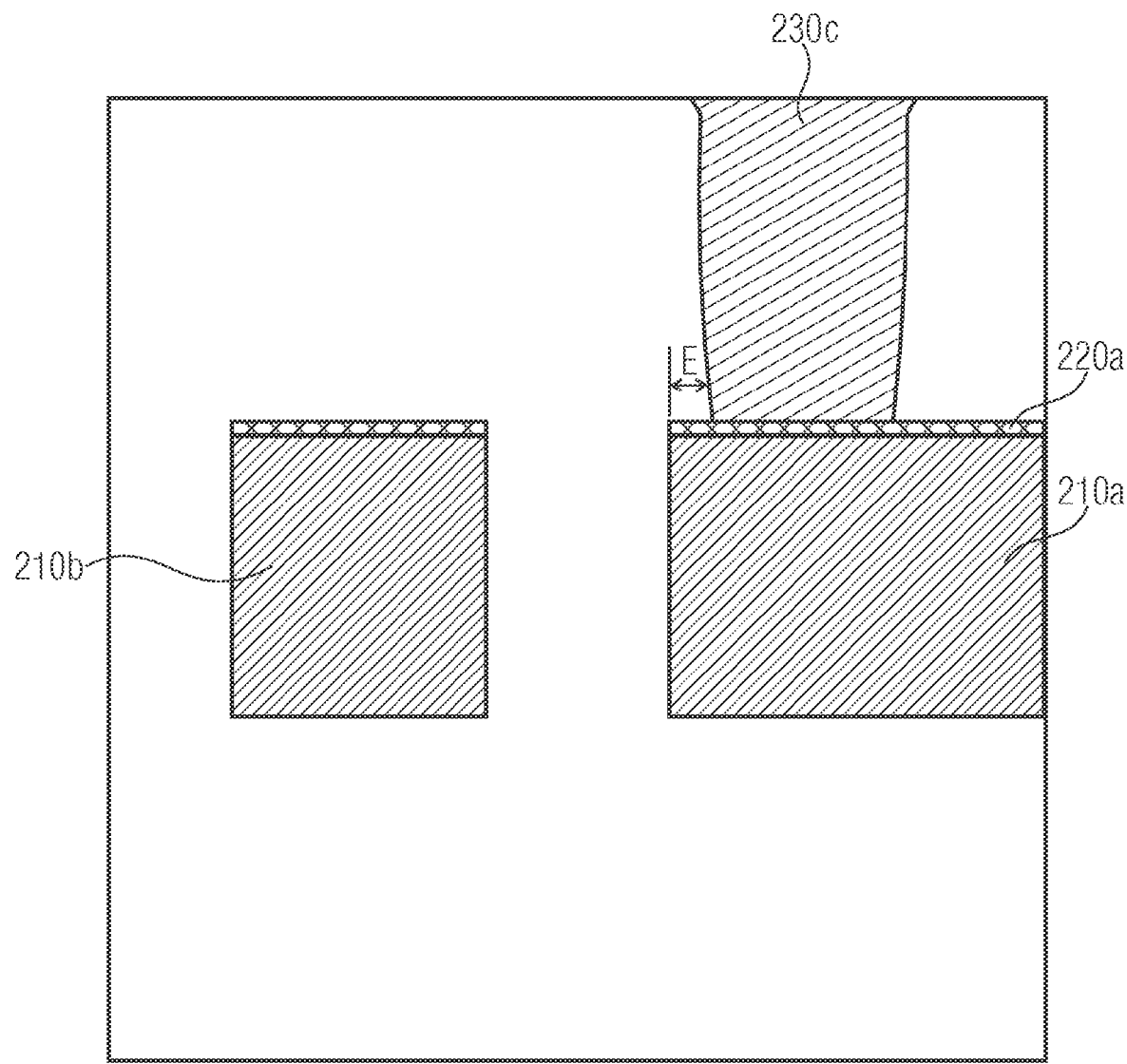
Figure 3C:
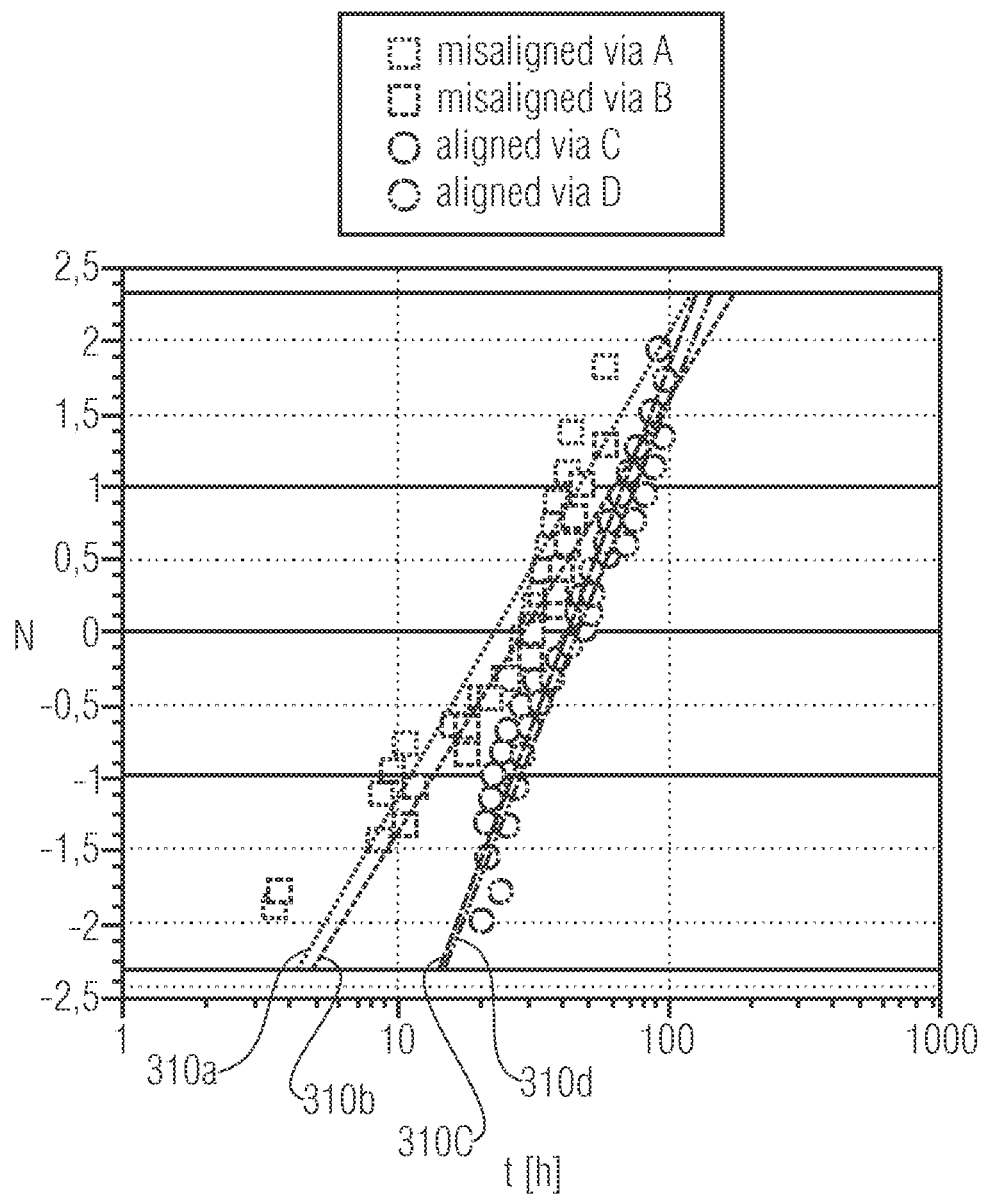

FIGS. 3*a* to 3*c* show a conventional device with a conductive via 230*a* ending on a conventional capping layer 220.

FIG. 3*a* shows manufacturing variations for a processed device, for example at different places on a wafer. In detail, two figures, one on the left and one on the right hand side, are shown on the top, in which the conductive vias 230*a*, 230*a*' slightly vary with respect to their lateral alignment. Each top figure comprising a first conventional conductive layer 210*a*, 210*a*' and a second conventional conductive layer 210*b*, 210*b*', wherein the first conductive layers 210*a*, 210*a*' comprise first capping layers 220*a*, 220*a*' and the second conductive layers 210*b*, 210*b*' comprises a second conductive capping layer 220*b*, 220*b*'. The first conductive layers 210*a*, 210*a*' are contacted with the conventional conductive vias 230*a*, 230*a*', which are both partially misaligned by the misalignment M (for the first conductive via 230*a* on the left hand side of the top figures) or by the misalignment M' (for the first conductive via 230*a*' on the right hand side of the top figures). As result in both cases the conductive vias 230*a*, 230*a*' extend along the sidewalls 212*a*, 212*a*' of the conductive layers 210*a*, 210*a*'.

On the bottom of FIG. 3*a* magnified pictures of the top figures are shown, which show more details of the conductive vias 230*a*, 230*a*' and the capping layers 220*a*, 220*a*'. For these conventional capping layers 220 no protection is provided for the conductive layers 210 which are thus in direct contact with the conductive vias 230. Hence, in processing the conductive vias 230, which use often aggressive chemistry, a damaging of the conductive layer 210 or an optional intermediate layer can in principle not be excluded. The lateral misalignments M, M' comprise, for example, a value within a range between about 50 and about 80 nm.

FIG. 3*b* shows in contrast to FIG. 3A an aligned conductive via 230*c* with the conductive layer 210*a*. This is the ideal situation, which in general cannot be ensured, or only with an increase in the manufacturing complexity and costs. Misaligned vias can be avoided only if a safety margin E of the conductive via 230*c* to the edge of the conductive capping layer 220*a* is bigger than the manufacturing variations in the misalignment M.

FIG. 3*c* shows a diagram of a failure distribution N with two examples A and B of misaligned conductive vias and two examples C and D of aligned vias. This distribution comprises the statistic obtained from manufacturing a device, for example, at different places on a wafer or on different wafers. The failure distribution as shown in FIG. 3*c* gives a percentage as a function of time t measured in hours of operation, for example, when a failure occurs. The distributions N are normalized such that N=0 corresponds to about a 50% failure rate. The misaligned examples A and B group together along the lines 310*a* and 310*b*, whereas the aligned example C and D are grouped together along the lines 310c and 310d. From this diagram it is clear that the aligned examples C and D comprise a significant improvement in the failure rate, which means the failure occurs at later times.

FIGS. 4a to 4e show a possible process flow for forming a conductive layer 110 with a conductive capping layer 120 according to embodiments of the present invention.

Figure 4A:
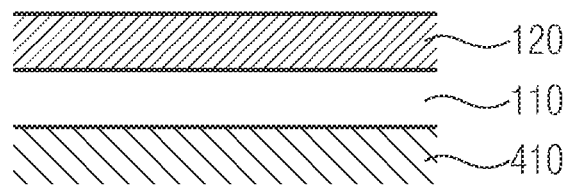
FIGS. 4a-4e show a process flow for forming a conductive layer with a conductive capping layer according to an embodiment.

FIG. 4a shows a first step, wherein on a substrate 410 the conductive layer 110 and the conductive capping layer 120 are formed such that the conductive layer 110 is arranged between the conductive capping layer 120 and the substrate 410. Optionally between the substrate 410 and the conductive layer 110 further conductive or dielectric layers can be formed.

Figure 4B:
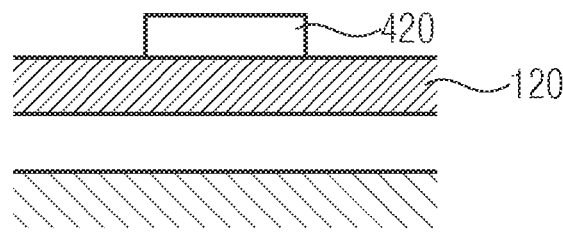

FIG. 4b shows as a next step a structuring or patterning, which can, for example, be performed by using a (hard) mask layer 420, which is formed on the conductive capping layer 120. The mask layer 420 defines the position or the region the conductive layer 110 shall be formed within.

Figure 4C:
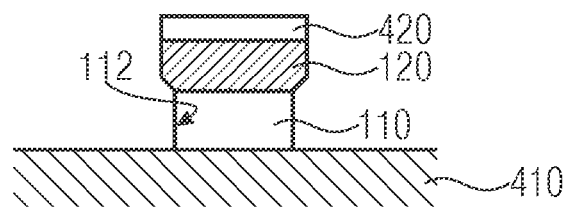

FIG. 4c shows the next step in which, for example, an etching is performed such that the conductive capping layer 120 and the conductive layer 110 are removed outside the region, which was defined by the hard mask layer 420. The etching can, for example, comprise multiple etching steps, which are selective with respect to the material used for the conductive capping layer 120 and another etching can be selective with respect to the material for the conductive layer 110. The substrate 410 acts as a stop layer for this etching process. Embodiments used for the etching process have different selectivities for the materials of the capping layer 120 and the conductive layer 110, so that the conductive layer 110 is laterally recessed in a direction towards the sidewall 112 of the conductive layer 110 (or in a direction anti-parallel to a normal vector of the sidewall 112). Due to this recess, the conductive capping layer 120 extends laterally beyond the sidewalls 112 of the conductive layer 110. In one or more embodiments, the conductive layer 110 may be etched at a faster rate than the capping layer 120.

Figure 4D:
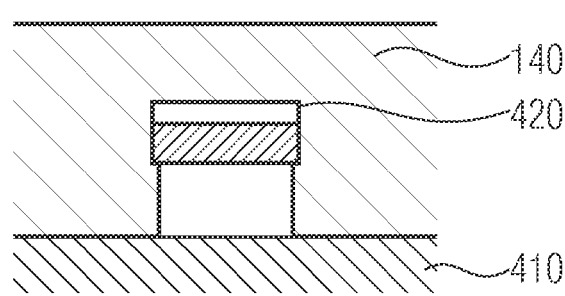

FIG. 4d shows the next step in which the dielectric layer 140 is formed on the substrate 410 and the remaining hard mask layer 420.

Figure 4E:
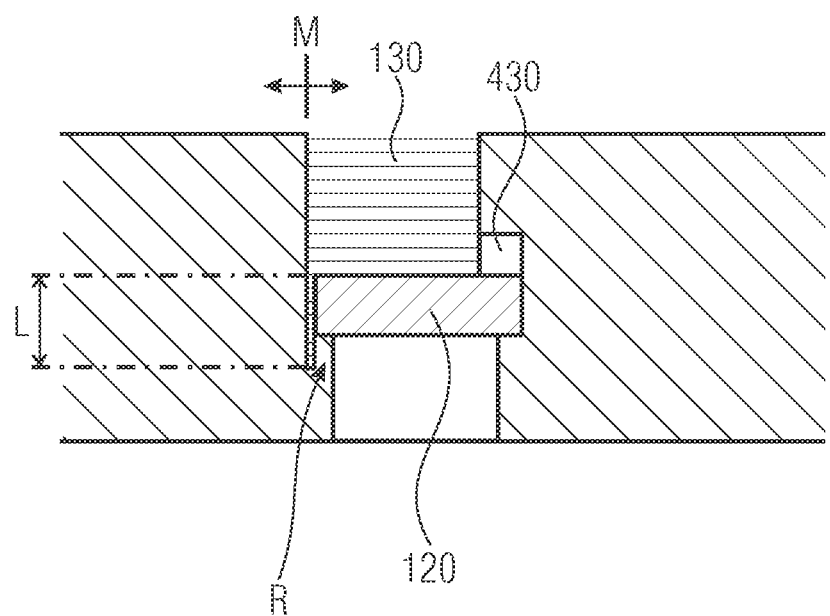

Finally, FIG. 4e shows how the dielectric layer 140 is opened and filled with conductive material so that the conductive via 130 contacts the conductive capping layer 120. The process of opening the dielectric layer 140 can, for example, comprise an etching step, which is selective with respect to the material of the dielectric layer 140 as well as with respect to the material of the mask layer 420. As a result, the mask layer 420 is removed on the conductive capping layer 120 and the conductive via 130 gets in direct contact with the conductive capping layer 120. A remaining part of the hard mask layer 430 can remain laterally next to the conductive via 130, which was not opened by this second etching step. This opening may comprise an overlay error M so that the lateral position of the conductive via 130 may vary within manufacturing variations and as consequence the conductive via 130 may extend also laterally next to the conductive capping layer 120 up to a depth L underneath a surface of the conductive capping layer 120.

This processing yields a conductive capping layer 120 which may be used to avoid the attack of the sidewall 112 of the conductive layer 110, because the misaligned via is separated from the conductive layer 110 still by a portion of the IMD dielectric layer 140 within the region R between the conductive layer 110 and the conductive via 130.

The overhang of the capping layer 120 with respect to the conductive layer 110 below can be accomplished by several further techniques or by combining several mechanisms. One example comprises an annealing step post the metal etch as shown in FIG. 4c, which leads to the lateral recess of the conductive layer 110 with respect to the conductive capping layer 120 over the whole sidewall 112. This annealing step can also be modified in a way that it makes additional use of a formation of aluminum titanate in the upper or lower part of the conductive layer 110. This aluminum titanate occurs, for example, since the conductive layer can comprise the element Al (for example, it may comprise aluminum metal) and the conductive capping layer 120 or the optional intermediate layer 125 comprise the element titanium (for example, it may comprise titanium metal such as pure titanium or titanium alloy) and both materials can react within the annealing step.

The forming of the aluminum titanate may result in a reduction of the volume since aluminum titanate may comprise a smaller volume than titanium metal itself. This process can, for example, be controlled by the amount of the element titanium added.

A further possibility for accomplishing the overhang of the conductive capping layer 120 may comprise, for example, a selective wet-etching step post the metal etch, wherein the selective wet-chemical etching removes material from the conductive layer 110, but less material from the conductive capping layer 120. The metal etch step comprises, for example, a reactive ion etching (RIE) and as explained at FIG. 4c this reactive ion etching can also be used for directly developing the roof of the conductive capping layer 120 due to its lower lateral etch rate of the conductive capping layer 120 compared to the material of the conductive layer 110.

Optionally between the steps as shown in FIG. 4c and 4d, further steps can be performed in order to generate the enhanced passivation layer 116 along the sidewalls 112 of the conductive layer 110. This enhanced sidewall passivation can also be used to avoid the attack of the sidewall 112 of the conductive layer by the processing of the misaligned via. The following steps can, for example, accomplish this passivation enhancement. One possibility is a passivation step post the RIE etching, which was used, for example, to form the structure as shown in FIG. 4c. This passivation step can, for example, comprise an oxidation, a plasma oxidation or a nitration. A further possibility to achieve the passivation comprises a wet-chemical passivation step, which can, for example, comprise a DSP clean (DSP=double side polishing). Finally an optional annealing step post the metal etching step can also generate the passivation layer 116.

Figure 5:
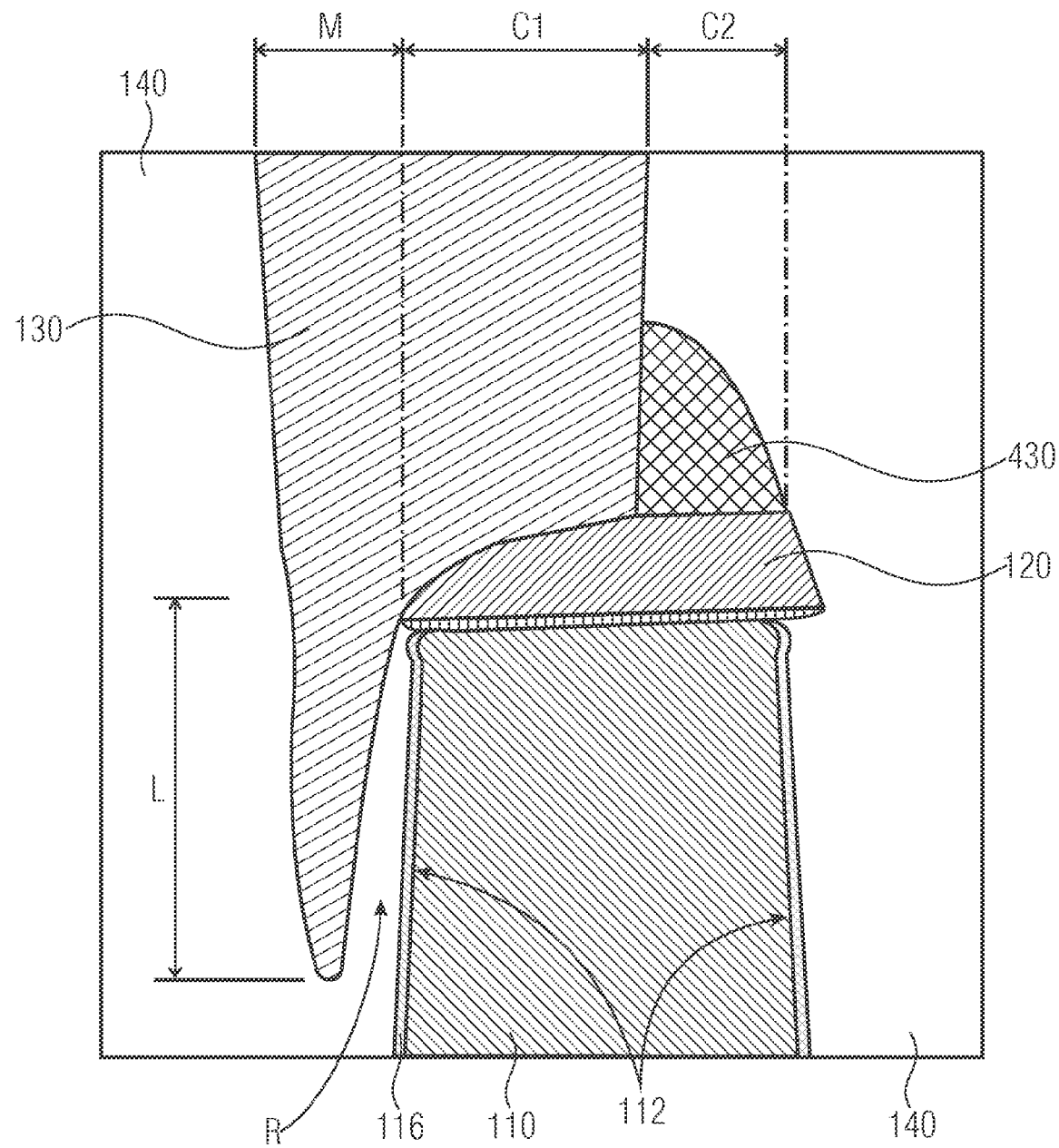
FIG. 5 shows an overhang provided by the conductive capping layer and enhanced sidewall passivation of the conductive layer.

FIG. 5 shows a misaligned via, wherein the conductive via 130 extends due to the overlay error M up to a depth L beneath the conductive capping layer 120. Due to the overhang of the conductive capping layer 120 there is still a barrier within the region R between the conductive via 130 and the conductive layer 110. The dielectric layer 140 can comprise, for example, an ILD oxide. In addition, the conductive layer 110 comprises the optional passivation layer 116 which provides an additional passivation barrier between the conductive via 130 and the conductive layer 110. FIG. 5 shows also the remaining part 430 of the hard mask layer, which was left over after the opening of the dielectric layer 140 as shown in FIG. 4e. The conductive via 130 contacts the conductive capping layer 120 over a contact region C1 comprising a diameter within a range of, for example, around 100 nm to 150 nm or of around 124 nm. Due to the overlay error M the conductive via 130 does not contact the conductive layer 110 within a region C2, which may, for example, comprise a value between 50 nm and 100 nm or of about 82 nm. The overlay error M can comprises, for example, a value within a range of about 10 nm to about 100 nm or of about 55 nm. The remaining part of the hard mask layer 430 can, for example, comprise silicon-oxy-nitride (SON).

The embodiment as shown in FIG. 5 comprises therefore both features, the first feature of overhang of the conductive capping layer 120 with respect to the conductive layer 110 and the second feature of the enhanced sidewall passivation 116, which is formed along the sidewall 112 of the conductive layer 110. The conductive layer 110 can, for example, be patterned by using a silicon-oxy-nitride hard mask.

Figure 6:
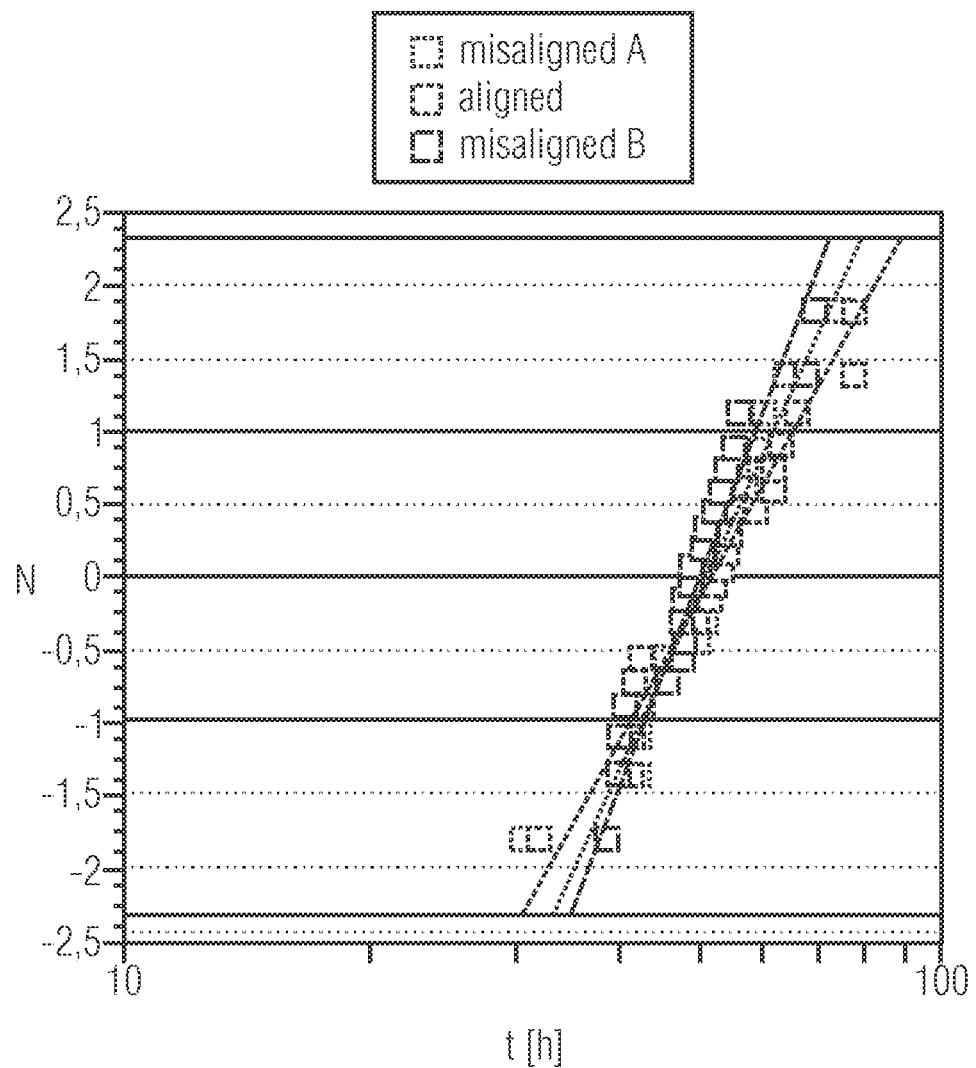
FIG. 6 shows a failure distribution for a conductive via using the conductive capping layer according to embodiments of the present invention.

FIG. 6 shows a further failure distribution, but now using a conductive capping layer 120 according to embodiments. Again a percentage of failure of conductive vias as a function of the time (as measured in hours of operation) is shown. In one example the conductive via is aligned, a first example A comprises misaligned conductive vias with respect to, for example, about 10 nm in one direction and a second example B corresponds to a misalignment of about 50 nm with respect to the other direction. The failure times of all three examples show now comparable results, so that the misaligned conductive vias show no detrimental effects with respect to the failure time. Therefore, embodiments of the present invention exhibit reliable misaligned or borderless vias with comparable fail times and same spread a as POR reference.

In order to achieve the benefits of the embodiments a highly selective via etch and a sufficient thickness for the conductive capping layer may be used.

In one or more embodiments, the conductive capping layer may comprise a via hole etch through the interlayer dielectric, which stops selectively in the capping layer. In one or more embodiments, the capping layer may serve as an anti-reflective coating layer. In one or more embodiments, the capping layer may, for example, include TiN or TaN. In one or more embodiments, the capping layer may include a titanium metal/TiN stack and/or a tantalum metal/TaN stack. A via etch may be performed with a stop in the capping layer or with a stop in the remaining hard mask 430 combined with a selective hard mask breakthrough. Embodiments of the present invention also comprise a modification of the typical metal etch (for example, the RIE etching) so that the etching rate is selective with respect to the materials of the conductive layer 110 and the conductive capping layer 120. For example, the selectivity can be chosen such that more material of the conductive layer 110 is removed than material of the conductive capping layer 120, which will form automatically the lateral overhang of the conductive capping layer 120. An optional DSP cleaning can also be included. This etching process can be adjusted so that the lateral etching rate and hence the desired overhang (lateral overhang) of the conductive capping layer 120 over the or beyond the sidewall 112 of the conductive layer 110 is achieved. The resulting overhang comprises a lateral dimension of the capping layer, which is larger than the dimension of the conductive layer (which, for example, may be a metal line) itself.

The optional intermediate layer 125 comprises a material, which may minimize the electromigration between the conductive capping layer 120 and the conductive layer 110. In one or more embodiments, the intermediate layer 125 may comprise any conductive material. In one or more embodiments, the intermediate layer 125 may be a metallic material. In one or more embodiments, the intermediate layer comprises the element Ti. The intermediate layer may comprises titanium metal such as pure titanium and/or titanium alloy. In an embodiment, the intermediate layer may comprise the element tantalum and may comprise tantalum metal (such as pure tantalum and/or tantalum alloy).

A further aspect is that also the stress migration should be minimized. Hence, embodiments show identical electro migration and/or stress migration and electrical parameters as non-misaligned test structures.

Figure 7:
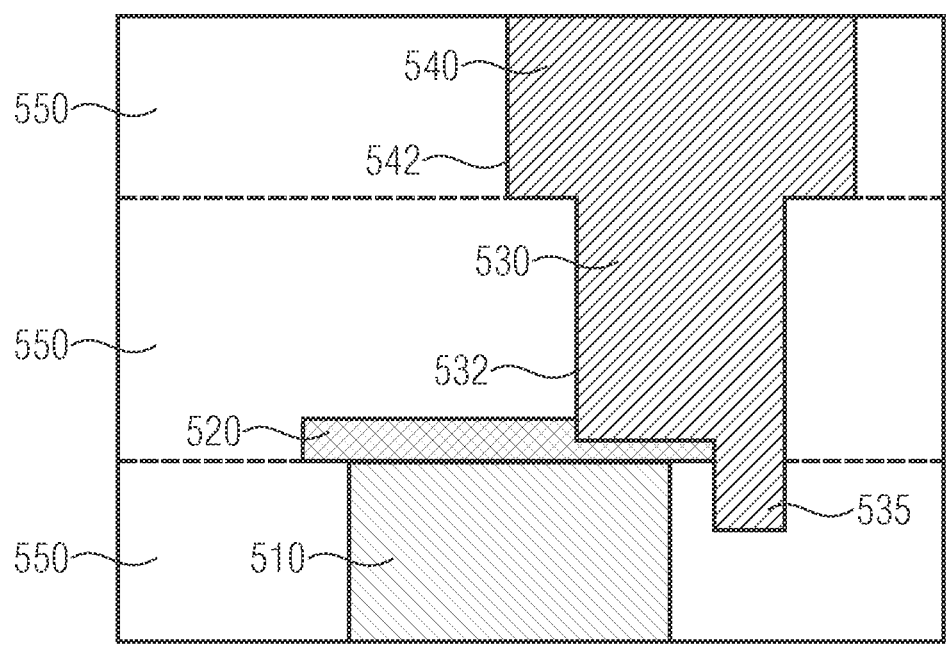
FIG. 7 shows a conductive via ending on a conductive capping layer according to an embodiment of the present invention.

The ideas described above are also applicable to damascene processes (for example, single or dual damascene processes). The damascene processing may be particularly useful in applications based upon a copper metal line technology. Another embodiment of the invention is shown in FIG. 7. FIG. 7 shows a lower metal layer 510, a capping layer 520, a metal via 530 and an upper metal layer 540. FIG. 7 also shows a dielectric material 550.

The upper metal layer 540 and the via 530 may be formed using a damascene process. Openings may first be formed in the dielectric material 550. A seed layer may then be formed on the surfaces of the openings and a metallic material may then be electroplated onto the seed layer. In one or more embodiments, the lower metal line 510, upper metal line 540 as well as the conductive via 530 may comprise any metallic material. In one or more embodiments, the metallic material may include the elements Cu and Al. In one or more embodiments, the metallic material may comprise copper metal and/or aluminum metal. The copper metal may be pure copper or copper ally. The aluminum metal may be aluminum metal or aluminum alloy.

The openings 532 and 542 may, for example, be formed by a dual damascene process. A capping layer 520 is formed over the lower metal line 510. The capping layer 520 is formed so as to have an overhang D. The capping layer 520 may comprise any of the materials described above for the capping layer. An intermediate layer may be disposed between the capping layer 520 and the metal line 510. The conductive via 530 is disposed over the metal line 510.

In the embodiment shown, the conductive via is misaligned such that a portion 535 of the conductive via 530 extends below the top surface of the lower metal layer 510. The portion 535 is spacedly disposed from a sidewall surface of the lower layer 510 by a portion of the dielectric material 550.

Features of embodiments of the present invention can easily be combined with any other features, process or method, in order to optimize the benefits under certain aspects.

What is claimed is:

1. A semiconductor device comprising:
   a conductive layer comprising a sidewall;
   a conductive capping layer disposed over the conductive layer and extending laterally beyond the sidewall of the conductive layer by a lateral overhang; and
   a conductive via disposed over the conductive capping layer, wherein a portion of the conductive capping layer is arranged between the conductive layer and the conductive via, and wherein the conductive via includes a portion extending past the conductive capping layer and laterally facing but spaced from the sidewall of the conductive layer by a distance.

2. The device of claim 1, further comprising a dielectric material disposed between the portion of the via and the sidewall, the dielectric material being part of an interlevel dielectric layer.

3. The device of claim 1, further comprising an intermediate layer disposed between the conductive capping layer and the conductive layer.

4. The device of claim 1, further comprising a passivation layer along the sidewall of the conductive layer.

5. The device of claim 1, wherein the conductive layer comprises a metallic material.

6. A semiconductor device comprising:
a conductive layer comprising a sidewall;
a conductive capping layer disposed over the conductive layer and extending laterally beyond the sidewall of the conductive layer by a lateral overhang;
a conductive via in electrical contact with the conductive capping layer, wherein a portion of the conductive capping layer is arranged between the conductive layer and the conductive via, and wherein the conductive via includes a portion extending past the conductive capping layer and laterally facing but spaced from the sidewall of the conductive layer by a distance; and
a dielectric material between the portion of the via and the sidewall, the dielectric material being part of an inter-level dielectric layer.

7. The device of claim 6, further comprising a passivation layer along the sidewall of the conductive layer.

8. The device of claim 6, wherein the conductive layer comprises a metallic material.

9. The device of claim 6, wherein the conductive via is in direct contact with the capping layer.

10. A semiconductor device comprising:
a metallic layer comprising a sidewall and formed in a dielectric layer;
a passivation layer disposed on the sidewall of the metallic layer between the metallic layer and the dielectric layer;
a conductive capping layer disposed over the metallic layer; and
a conductive via disposed over the capping layer and including a portion disposed on the passivation layer.

11. The device of claim 10, wherein the passivation layer comprises an oxide or a nitride.

12. The device of claim 10, wherein the passivation layer comprises aluminum oxide.

13. The device of claim 10, wherein a portion of the conductive capping layer is arranged between the metallic layer and the conductive via.

* * * * *